United States Patent
Chiao et al.

(10) Patent No.: US 10,483,235 B2
(45) Date of Patent: Nov. 19, 2019

(54) STACKED ELECTRONIC DEVICE AND METHOD FOR FABRICATING THE SAME

(71) Applicant: Winbond Electronics Corp., Taichung (TW)

(72) Inventors: Yu-Cheng Chiao, Taichung (TW); Tung-Yi Chan, Taichung (TW); Chen-Hsi Lin, Taichung (TW); Chia Hua Ho, Hsinchu (TW); Meng-Chang Chan, Taichung (TW); Hsin-Hung Chou, Changhua (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/057,973

(22) Filed: Mar. 1, 2016

(65) Prior Publication Data

US 2016/0329244 A1 Nov. 10, 2016

(30) Foreign Application Priority Data

May 8, 2015 (CN) .......................... 2015 1 0230562

(51) Int. Cl.
*H01L 25/065* (2006.01)

(52) U.S. Cl.
CPC *H01L 25/0657* (2013.01); *H01L 2225/06541* (2013.01)

(58) Field of Classification Search
CPC ........... H01L 25/0657; H01L 23/49827; H01L 21/4867; H01L 23/5328; H01L 23/5329;
(Continued)

(56) References Cited

U.S. PATENT DOCUMENTS

| 8,716,867 | B2 | 5/2014 | Ko et al. |
| 2005/0133823 | A1* | 6/2005 | Mori ...................... H05K 3/125 257/200 |

(Continued)

FOREIGN PATENT DOCUMENTS

| CN | 1638605 A | 7/2005 |
| JP | 2005183803 A | 7/2005 |

(Continued)

*Primary Examiner* — Steven H Loke
*Assistant Examiner* — Juanita B Rhodes
(74) *Attorney, Agent, or Firm* — Muncy, Geissler, Olds & Lowe, P.C.

(57) ABSTRACT

A method for fabricating a stacked electronic device is provided. A first three-dimensional (3D) printing is performed to form a first insulating layer and a plurality of first redistribution layers (RDLs) on a first substrate. A second 3D printing is performed to form a second substrate and a plurality of through-substrate vias (TSVs) on the first insulating layer, in which the plurality of TSVs is electrically connected to the plurality of first RDLs. A third 3D printing is performed to form a second insulating layer and a plurality of second RDLs on the second substrate, in which the plurality of second RDLs is electrically connected to the plurality of TSVs. A plurality of contacts of a third substrate is bonded to the plurality of second RDLs, so that the substrate is mounted onto the second insulating layer. The disclosure also provides a stacked electronic device formed by such a method.

12 Claims, 3 Drawing Sheets

(58) Field of Classification Search
CPC ............ H01L 23/3157; H01L 21/4803; H01L 2224/131; H01L 21/288; H01L 21/76801; H01L 23/525; H01L 24/81; H01L 2224/0239; H01L 2224/02317; H01L 2224/05548; H01L 2224/0401; H01L 24/05; H01L 2224/02311; H01L 2224/16227; H01L 2224/16145; H01L 2225/06541

See application file for complete search history.

(56) References Cited

U.S. PATENT DOCUMENTS

| | | | | |
|---|---|---|---|---|
| 2006/0154468 | A1* | 7/2006 | Tanaka | G02F 1/13452 438/613 |
| 2013/0277841 | A1* | 10/2013 | Lii | H01L 24/20 257/741 |
| 2013/0344654 | A1* | 12/2013 | Limousin | H01L 24/11 438/108 |
| 2015/0197063 | A1* | 7/2015 | Shinar | G06F 17/50 700/98 |
| 2016/0118252 | A1* | 4/2016 | Ishihara | H01L 21/02422 438/479 |

FOREIGN PATENT DOCUMENTS

| | | | | |
|---|---|---|---|---|
| JP | 2007158352 A | | 6/2007 | |
| JP | WO 2015041189 A1 * | | 3/2015 | ............ H05K 3/125 |
| TW | 200704314 A | | 1/2007 | |
| TW | I334751 B | | 12/2010 | |
| WO | WO-2015041189 A1 * | | 3/2015 | |
| WO | WO 2015041189 A1 | | 3/2015 | |

* cited by examiner

STACKED ELECTRONIC DEVICE AND METHOD FOR FABRICATING THE SAME

CROSS REFERENCE TO RELATED APPLICATIONS

This application claims the benefit of China Patent Application No. 201510230562.X filed on May 8, 2015, entitled "STACKED ELECTRONIC DEVICE AND METHOD FOR FABRICATING THE SAME" which is hereby incorporated herein by reference.

BACKGROUND

Field of the Disclosure

The present disclosure relates to a semiconductor technology, and in particular, it relates to a stacked electronic device fabricated by using a three-dimensional (3D) printing technology.

Description of the Related Art

Developments have driven the semiconductor industry to increase the integration or density of electronic devices such as transistors, diodes, resistors, and capacitors. In an attempt to further increase integrated circuit (IC) density, three-dimensional ICs (3DICs) have been investigated. Typically, 3DICs use through-substrate vias (TSVs) as electrical connection paths to accomplish a stack structure of wafers or chips, thereby increasing the electronic device integration or density.

In the fabrication of the 3DIC, chips or wafers are bonded together with a substrate (e.g., a chip, wafer or printed circuit board (PCB)), and electrical connections are formed between each chip/wafer and the contacts of the substrate. Moreover, TSVs are typically fabricated by forming via holes in the substrate (e.g., a chip or wafer) using a dry etching or laser drilling process, and then filling the via holes with conductive materials. Thereafter, the substrate, another wafer/chip and a carrier substrate are arranged in a stack, and then a substrate thinning process is performed by a chemical mechanical polishing (CMP) process, so that the via holes become through holes with exposed conductive materials, so as to form TSVs. Finally, the carrier substrate is removed to form a stacked electronic device. Compared to the traditional electronic device with bonding wires, the 3D stacked electronic device with TSVs may reduce the internal electrical connection paths, thereby increasing the transmission speed of the device, reducing the noise, and enhancing the device performance.

However, as mentioned above, since the fabrication of TSV includes the steps of forming via holes, filling the via holes with conductive materials, thinning the substrate, and removing the carrier substrate, it cannot effectively reduce the fabrication time, simplify the process, or reduce the manufacturing cost. Therefore, there is a need to develop a method for fabricating a stacked electronic device capable of addressing the above problems.

SUMMARY

In some embodiments of the disclosure, a method for fabricating a stacked electronic device is provided. The method includes providing a first substrate. A first three-dimensional (3D) printing is performed to form a first insulating layer and a plurality of first redistribution layers (RDLs) on the first substrate. The plurality of first RDLs is embedded in the first insulating layer. A second 3D printing is performed to form a second substrate and a plurality of through-substrate vias (TSVs) on the first insulating layer. The plurality of TSVs passes through second substrate and is electrically connected to the plurality of first RDLs. A third 3D printing is performed to form a second insulating layer and a plurality of second RDLs on the second substrate. The plurality of second RDLs is embedded in the second insulating layer and electrically connected to the plurality of TSVs. A plurality of contacts of a third substrate is bonded to the plurality of second RDLs, so that the third substrate is mounted onto the second insulating layer.

In some embodiments of the disclosure, a stacked electronic device is provided. The stacked electronic device includes a first substrate. A first insulating layer and a plurality of first RDLs are disposed on the first substrate. The plurality of first RDLs is embedded in the first insulating layer. A second substrate and a plurality of TSVs are disposed on the first insulating layer. The plurality of TSVs passes through second substrate and is electrically connected to the plurality of first RDLs. A second insulating layer and a plurality of second RDLs are disposed on the second substrate. The plurality of second RDLs is embedded in the second insulating layer and electrically connected to the plurality of TSVs. A third substrate is mounted onto the second insulating layer. The third substrate has a plurality of contacts bonded to the plurality of second RDLs. The first insulating layer, the plurality of first RDLs, the second substrate, the plurality of TSVs, the second insulating layer, and the plurality of RDLs are formed of materials used in 3D printing.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
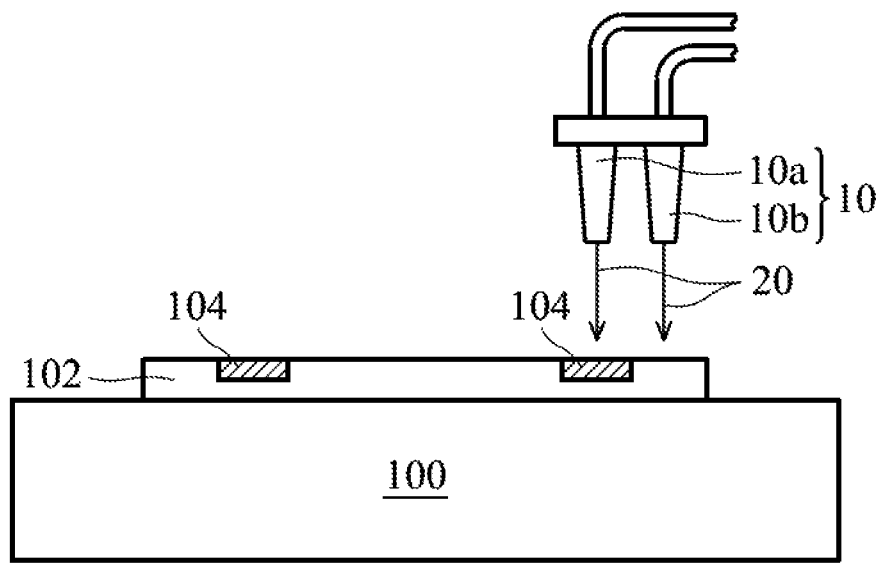
FIGS. 1A to 1D are cross sections of a method for fabricating a stacked electronic device according to an embodiment of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Figure 1B:
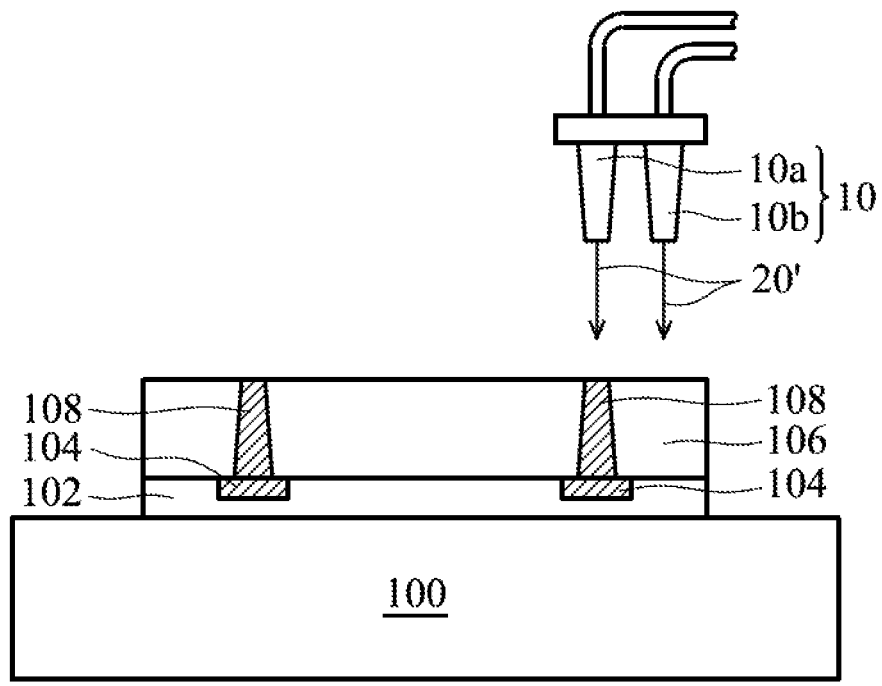
Figure 1C:
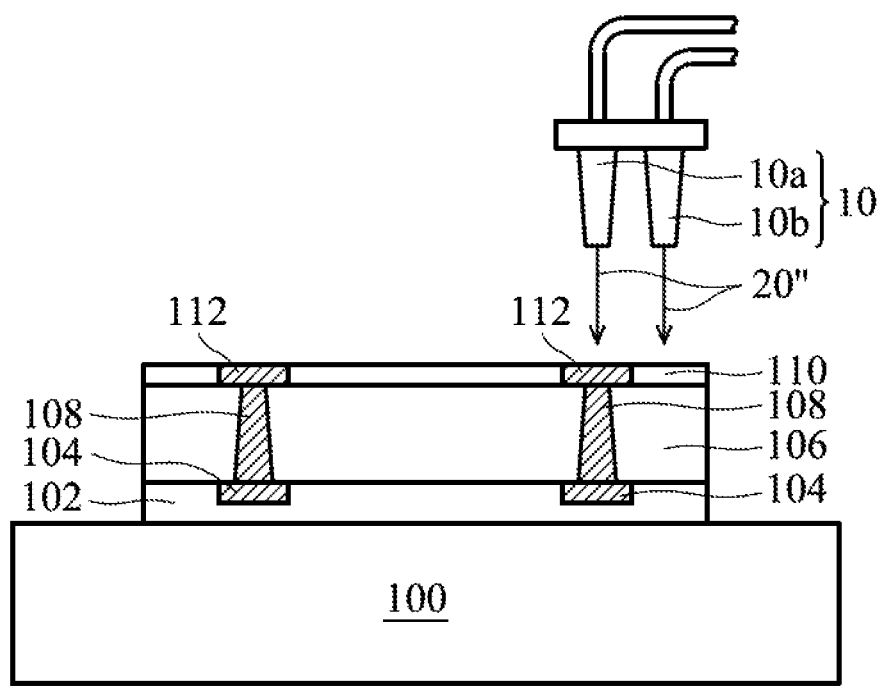
Figure 1D:
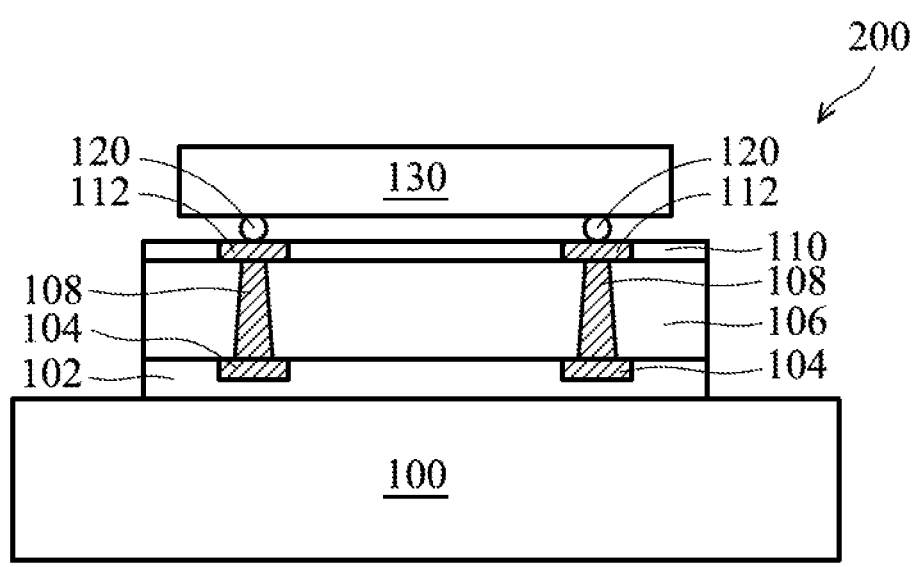

Referring to FIG. 1D, which illustrates a cross section of an exemplary embodiment of a stacked electronic device according to the present disclosure. The stacked electronic device 200 includes a first substrate 100, a first insulating layer 102, a plurality of RDLs 104, a second substrate 106, a plurality of TSVs 108, a second insulating layer 110, a plurality of second RDLs 112, and a third substrate 130. In one embodiment, the first substrate 100 may include a PCB, a wafer, a chip, or a combination thereof.

The first insulating layer 102 and the plurality of first RDLs 104 are disposed on the first substrate 100, in which the plurality of first RDLs 104 is embedded into the first insulating layer 102 and is electrically connected to contacts (not shown) of the first substrate 100. The contacts of the first substrate 100 may include pads, solder bumps, conductive posts, or a combination thereof. Here, in order to simplify the diagram, only two single conductive layers are depicted to represent the plurality of first RDLs 104. However, note that each of the plurality of first RDLs 104 may include a single conductive layer or a multi-layer conductive structure, and the number of first RDLs 104 is based on the demands of the design and is not limited to that shown in FIG. 1D.

In the embodiment, the first insulating layer 102 and the plurality of first RDLs 104 are formed of materials that are used in a 3D printing. For example, the first insulating layer 102 may include a ceramic material, a polymer material, a resin material, or a dielectric material used for a 3D printing technology. Moreover, the plurality of first RDLs 104 may include a conductive metal used for a 3D printing technology, such as aluminum, copper, gold, lead-free solder, their alloys, or other metal alloys.

The second substrate 106 and the plurality of TSVs 108 are disposed on the first insulating layer 104. The plurality of TSVs 108 passes through the second substrate 106 and is electrically connected to the plurality of first RDLs 104. Here, in order to simplify the diagram, only two TSVs are depicted. However, note that the number of TSVs 108 is based on the demands of the design and is not limited to that shown in FIG. 1D.

In the embodiment, the second substrate 106 is free from any active or passive device therein. Moreover, the second substrate 106 and the plurality of TSVs 108 are formed of materials that are used in a 3D printing. For example, the second substrate 106 may include a molding compound material, a ceramic material, a polymer material, a resin material, or a dielectric material used for a 3D printing technology. Moreover, the plurality of TSVs 108 may include a conductive metal used for a 3D printing technology, such as tungsten, aluminum, copper, gold, lead-free solder, their alloys, or other metal alloys. In another embodiment, the second substrate 106 may include a semiconductor material, such as silicon or germanium. In this case, the stacked electronic device 200 may further include insulating spacers to electrically isolate the second substrate 106 from the plurality of TSVs 108. The insulating spacer may include a ceramic material, a polymer material, a resin material, or a dielectric material used for a 3D printing technology.

The second insulating layer 110 and the plurality of second RDLs 112 are disposed on the second substrate 106, in which the plurality of second RDLs 112 is embedded into the second insulating layer 110 and is electrically connected to the plurality of TSVs 108. Here, in order to simplify the diagram, only two single conductive layers are depicted to represent the plurality of second RDLs 112. However, note that each of the plurality of second RDLs 112 may include a single conductive layer or a multi-layer conductive structure, and the number of second RDLs 112 is based on the demands of the design and is not limited to that shown in FIG. 1D.

In the embodiment, the second insulating layer 110 and the plurality of second RDLs 112 are formed of materials that are used in a 3D printing. For example, the second insulating layer 110 may include a ceramic material, a polymer material, a resin material, or a dielectric material used for a 3D printing technology. Moreover, the plurality of second RDLs 112 may include a conductive metal used for a 3D printing technology, such as aluminum, copper, gold, lead-free solder, their alloys, or other metal alloys.

The third substrate 130 is mounted onto the second insulating layer 110. In the embodiment, the third substrate 130 may be a wafer, a chip, or a combination thereof. Moreover, the third substrate 130 has a plurality of contacts 120 that is bonded to the plurality of second RDLs 112. The plurality of contacts 120 may include pads, solder bumps, conductive posts, or a combination thereof. Here, exemplary solder bumps are represented for the plurality of contacts 120.

Figure 2:
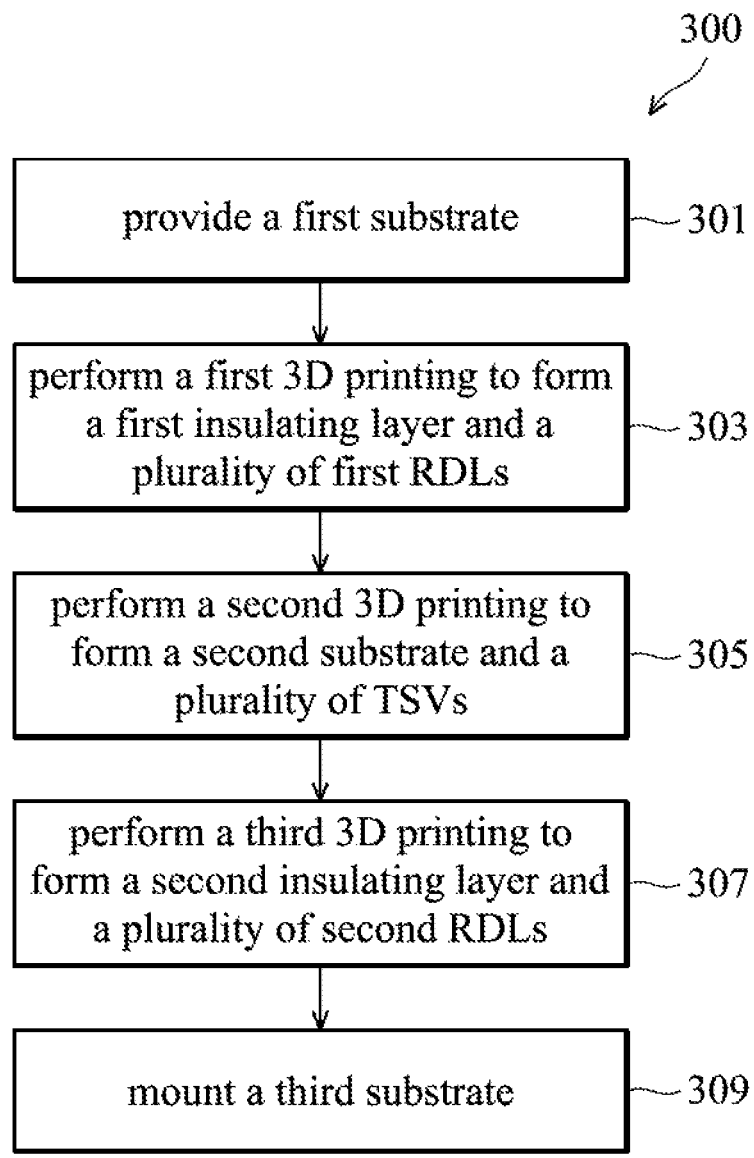
FIG. 2 shows a flow chart of a method for fabricating a stacked electronic device according to an embodiment of the present disclosure.

Next, referring to FIGS. 1A to 1D and FIG. 2, in which FIGS. 1A to 1D illustrate cross sections of a method for fabricating a stacked electronic device according to an embodiment of the present disclosure, and FIG. 2 shows a flow chart of a method 300 for fabricating a stacked electronic device according to an embodiment of the present disclosure. In the embodiment, the method 300 begins in step 301, in which a first substrate 100 is provided, as shown in FIG. 1A. In one embodiment, the first substrate 100 may include a PCB, a wafer, a chip, or a combination thereof. The first substrate 100 may include contacts (not shown), such as pads, solder bumps, conductive posts, or a combination thereof.

Next, still referring to FIGS. 1A and 2, in step 303, a first 3D printing 20 is performed using a 3D printer 10, to form a first insulating layer 102 and a plurality of first RDLs 104 on the first substrate 100. The plurality of first RDLs 104 is embedded in the first insulating layer 102 and is electrically connected to the contacts (not shown) of the first substrate 100. In the embodiment, the 3D printer 10 may have multiple print heads so as to simultaneously form the first insulating layer 102 and the plurality of first RDLs 104 after performing the first 3D printing 20. For example, during the first 3D printing 20, the 3D printer 10 moves back and forth along a direction parallel to the first substrate 100, to form the first insulating layer 102 by using a first print head 10a and form the plurality of first RDLs 104 by using a second print head 10b. In the embodiment, the first insulating layer 102 may include a ceramic material, a polymer material, a resin material, or a dielectric material used for a 3D printing technology. Moreover, the plurality of first RDLs 104 may include a conductive metal, such as aluminum, copper, gold, lead-free solder, their alloys, or other metal alloys.

Next, referring to FIGS. 1B and 2, in step 305, a second 3D printing 20' that is similar to the first 3D printing 20 is performed using the 3D printer 10, to form a second substrate 106 and a plurality of TSVs 108 on the first insulating layer 102. The plurality of TSVs 108 passes through the second substrate 106 and is electrically connected to the plurality of first RDLs 104. In the embodiment, the second substrate 106 and the plurality of TSVs 108 are simultaneously formed after performing the second 3D printing 20'. For example, during the second 3D printing 20', the second substrate 106 is formed by using the first print head 10a and the plurality of TSVs 108 by using the second print head 10b. In the embodiment, the second substrate 106 may include a molding compound material, a ceramic material, a polymer material, a resin material, or a dielectric material used for a 3D printing technology. Moreover, the plurality of TSVs 108 may include a conductive metal, such as tungsten, aluminum, copper, gold, lead-free solder, their alloys, or other metal alloys. In the embodiment, the time for performing the second 3D printing 20' may be adjusted, so that the formed second substrate 106 has a desired thickness. Moreover, the plurality of TSVs 108 is exposed from the surface of the second substrate 106 because the plurality of TSVs 108 passes through the second substrate 106. Therefore, there is no need to perform any polishing process (e.g., a CMP process) to adjust the thickness of the second substrate 106 for formation of the plurality of TSVs 108.

In another embodiment, the second substrate 106 may include a semiconductor material (e.g., silicon or germanium) used for a 3D printing technology. In this case, the 3D printer 10 may include at least three print heads, and the second 3D printing 20' is performed to further form insulating spacers to electrically isolate the second substrate 106 from the plurality of TSVs 108. The insulating spacer may include a ceramic material, a polymer material, a resin material, or a dielectric material.

Next, referring to FIGS. 1C and 2, in step 307, a third 3D printing 20" that is similar to the first 3D printing 20 is performed using the 3D printer 10, to form a second insulating layer 110 and a plurality of second RDLs 112 on the second substrate 106. The plurality of second RDLs 112 is embedded in the second insulating layer 110 and is electrically connected to plurality of TSVs 108. In the embodiment, the second insulating layer 110 and the plurality of second RDLs 112 are simultaneously formed after performing the third 3D printing 20". For example, during the third 3D printing 20", the second insulating layer 110 is formed by using the first print head 10a of the 3D printer 10 and the plurality of second RDLs 112 is formed by using a second print head 10b of the 3D printer 10. In the embodiment, the second insulating layer 110 may include a material that is the same as or different from that of the first insulating layer 102. Moreover, the plurality of second RDLs 112 may include a material that is the same as or different from that of the plurality of first RDLs 104.

Next, referring to FIGS. 1D and 2, in step 309, a plurality of contacts 120 of a third substrate 130 is bonded to the plurality of second RDLs 112, so that the third substrate 130 is mounted onto the second insulating layer 110. In the embodiment, the third substrate 130 may be a wafer, a chip, or a combination thereof. Moreover, the plurality of contacts 120 is bonded to the plurality of second RDLs 112. The plurality of contacts 120 may include pads, solder bumps, conductive posts, or a combination thereof. For example, the third substrate 130 includes a chip and the plurality of contacts 120 includes a plurality of solder bumps. Moreover, the plurality of contacts 120 is bonded to the plurality of second RDLs 112 by a flip chip technology.

According to the foregoing embodiments, since the first insulating layer 102 and the plurality of first RDLs 104, the second substrate 106 and the plurality of TSVs 108, and the second insulating layer 110 and the plurality of second RDLs 112 are successively formed by 3D printing, the manufacturing time for the stacked electronic device can be effectively reduced. Moreover, the TSV is formed by 3D printing can eliminate the gap-filling difficulty caused by high aspect ratio. As a result, TSVs with high reliability can be accomplished. Moreover, compared to the traditional fabrication of TSVs, there is no need to perform the additional processing steps of forming via holes, filling the via holes with conductive materials, thinning the substrate, and removing the carrier substrate by the use of 3D printing for formation of TSVs. As a result, the processes for fabricating the device can be effectively simplified and the manufacturing cost can be reduced while problems caused by the additional processing steps mentioned above can be eliminated.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a stacked electronic device, comprising:
   providing a first substrate, wherein the first substrate comprises a wafer, a chip, or a combination thereof;
   performing a first three-dimensional (3D) printing to form a first insulating layer and a plurality of first redistribution layers (RDLs) on the first substrate, wherein the plurality of first RDLs is embedded in the first insulating layer and is electrically connected to contacts of the first substrate;
   performing a second 3D printing to form a second substrate, a plurality of through-substrate vias (TSVs) and insulating spacers on the first insulating layer simultaneously and respectively by at least three print heads, wherein the plurality of TSVs pass through the second substrate and are electrically connected to the plurality of first RDLs, and the insulating spacers electrically isolate the second substrate from the plurality of TSVs;
   performing a third 3D printing to form a second insulating layer and a plurality of second RDLs on the second substrate, wherein the plurality of second RDLs is embedded in the second insulating layer and electrically connected to the plurality of TSVs; and
   bonding a plurality of contacts of a third substrate to the plurality of second RDLs, so that the third substrate is mounted onto the second insulating layer.

2. The method as claimed in claim 1, wherein the first insulating layer and the second insulating layer comprise a ceramic material, a polymer material, a resin material, or a dielectric material.

3. The method as claimed in claim 1, wherein the plurality of first RDLs and the plurality of second RDLs comprise aluminum, copper, gold, or their alloys.

4. The method as claimed in claim 1, wherein the second substrate comprises a molding compound material, a ceramic material, a polymer material, a resin material, or a dielectric material.

5. The method as claimed in claim 1, wherein the second substrate comprises a semiconductor material.

6. The method as claimed in claim 1, wherein the plurality of TSVs comprises tungsten, aluminum, copper, gold, lead-free solder, or their alloys.

7. The method as claimed in claim 1, wherein a 3D printer employed to perform the first and third 3D printings has at least two print heads, so that at least two different materials are simultaneously formed during each of the first and third 3D printings.

8. The method as claimed in claim 1, wherein the insulating spacers comprise a ceramic material, a polymer material, a resin material, or a dielectric material.

9. The method as claimed in claim 1, wherein the third substrate is a wafer, a chip, or a combination thereof.

10. The method as claimed in claim 1, wherein the second substrate is thicker than the first insulating layer and the second insulating layer.

11. The method as claimed in claim 1, wherein aspect ratios of the plurality of TSVs are higher than aspect ratios of the plurality of first RDLs and aspect ratios of the plurality of second RDLs.

12. The method as claimed in claim 1, wherein the plurality of first RDLs and the plurality of second RDLs comprise a multi-layer conductive structure.

\* \* \* \* \*